United States Patent
Ko et al.

(10) Patent No.: US 7,563,667 B2
(45) Date of Patent: Jul. 21, 2009

(54) METHOD FOR FABRICATING SEMICONDUCTOR DEVICE

(75) Inventors: Choul Joo Ko, Seongnam-si (KR); Yong Jun Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 39 days.

(21) Appl. No.: 12/002,241

(22) Filed: Dec. 13, 2007

(65) Prior Publication Data

US 2008/0176370 A1 Jul. 24, 2008

(30) Foreign Application Priority Data

Dec. 27, 2006 (KR) .................... 10-2006-0134525

(51) Int. Cl.
- H01L 21/8234 (2006.01)
- H01L 21/8244 (2006.01)
- H01L 21/8242 (2006.01)
- H01L 21/336 (2006.01)

(52) U.S. Cl. .......... 438/238; 438/239; 438/244; 438/250; 438/253; 438/257; 257/E21.663; 257/E21.664; 257/E21.647; 257/E21.648; 257/E21.65

(58) Field of Classification Search .......... 257/E21.663, 257/E21.664, E21.647, E21.648, E21.65, 257/E21.653, E21.678
See application file for complete search history.

(56) References Cited

U.S. PATENT DOCUMENTS 6,309,925 B1 * 10/2001 Jung et al. .................. 438/250

| | | | |
|---|---|---|---|
| 2001/0006241 A1 | 7/2001 | Yang | |
| 2004/0188777 A1* | 9/2004 | Hwang | .................. 257/403 |
| 2007/0111438 A1* | 5/2007 | Chiang et al. | ............... 438/253 |

FOREIGN PATENT DOCUMENTS

| KR | 2001-0058495 | 7/2001 |
|---|---|---|
| KR | 10-2006-0077065 | 7/2006 |

OTHER PUBLICATIONS

Jae Han Cha; System on Chip Device and Method for Manufacturing the Same by Forming Memory Capacitor Prior to Formation of Logic Gate; Korean Patent Abstracts; Publication No. 1020060077065 A; Publication Date: Jul. 5, 2006; Korean Intellectual Property Office, Republic of Korea.

Bi Ryong Yang; Semiconductor Memory Device with Dual Layer and Titanium Layer for Preventing Hydrogen Diffusion and Method for Manufacturing the Same; Publication No. 1020010058495 A; Publication Date: Jul. 6, 2001; Korean Intellectual Property Office, Republic of Korea.

* cited by examiner

*Primary Examiner*—Walter L Lindsay, Jr.
*Assistant Examiner*—Mohsen Ahmadi
(74) *Attorney, Agent, or Firm*—The Law Offices of Andrew D. Fortney; Andrew D. Fortney

(57) ABSTRACT

In a method for forming a semiconductor device, a device isolation layer is formed in a capacitor region of a silicon substrate, and a bottom electrode and a dielectric layer are formed on the device isolation layer. Insulation sidewalls are formed on both sides of the bottom electrode. A top electrode is formed on the dielectric layer, and simultaneously a gate electrode is formed in a transistor region of the silicon substrate. Source/drain impurity regions are formed in the silicon substrate at both sides of the gate electrode.

18 Claims, 3 Drawing Sheets

METHOD FOR FABRICATING SEMICONDUCTOR DEVICE

RELATED APPLICATIONS

The present application claims priority under 35 U.S.C. 119 and 35 U.S.C. 365 to Korean Patent Application No. 10-2006-0134525 (filed on Dec. 27, 2006), which is hereby incorporated by reference in its entirety.

BACKGROUND

According to a related art semiconductor manufacturing method, a process of forming an integrated semiconductor device includes forming a polysilicon/insulator/polysilicon (PIP) capacitor. FIG. 1 is a sectional view illustrating the problems according to the related art.

With the development of silicon semiconductor technologies, various methods have been introduced for integration of memory technology and logic technology. Memory technology generally performs data storing functions, and logic technology, such as that used to manufacture a central processing unit (CPU), a signal processor, etc., may perform data processing functions. Additionally, other technologies such as analog and radio frequency (RF) technologies can be integrated into logic and/or memory technologies.

Various devices such as transistors, capacitors, and resistors can be integrated into a chip or other semiconductor device to form a semiconductor integrated circuit (IC). Various methods have been developed for efficiently integrating such devices. An analog capacitor, such as a polysilicon/insulator/polysilicon (PIP) capacitor or a metal/insulator/metal (MIM) capacitor, is mainly used for a logic circuit, such as a complementary metal oxide semiconductor (CMOS) logic circuit.

The PIP capacitor is widely used for an analog device to prevent noise and perform frequency modulation. FIG. 1 is a cross-sectional view illustrating a semiconductor device including a PIP capacitor and a logic circuit according to the related art. In FIG. 1, A denotes a resistor region, B denotes a capacitor region, and C denotes a logic transistor region.

Referring to FIG. 1, a device isolation layer 3 is formed in a silicon substrate 1 to define an active region. A resistor 7 is formed in the resistor region A of the silicon substrate 1. A PIP capacitor is formed in the capacitor region B. The PIP capacitor includes a bottom electrode 9, a dielectric layer 13, and a top electrode 15.

Metal oxide semiconductor (MOS) transistors are formed in the logic transistor region C. Each of the MOS transistors include a gate insulation layer 5 formed on the silicon substrate 1, a gate electrode 11 formed on the gate insulation layer 5, and source and drain regions 10 formed adjacent to the gate electrode 11 in the active region defined by the device isolation layer 3.

First and second interlayer insulation layers 17 and 19 are formed on the silicon substrate 1 to cover the resistor 7, the PIP capacitor, and the MOS transistors. Contact plugs 21 and 25 are formed through the first and second interlayer insulation layers 17 and 19. The contact plugs 21 and 25 are connected to the PIP capacitor and the MOS transistors. Metal lines 27 are then formed to connect the contact plugs 21 and 25.

In the semiconductor device shown in FIG. 1, the capacitance of the PIP capacitor is determined by the area of the dielectric layer 13 formed between the bottom and top electrodes 9 and 15.

By reducing the number of process steps to produce a semiconductor device that includes a PIP capacitor, as described above (e.g., an IC), a more efficient fabrication and a device with improved characteristics can be achieved. Additionally, the device could be fabricated with less concern for the PIP thermal budget.

SUMMARY

Accordingly, embodiments of the present invention concern a method for manufacturing a semiconductor device that substantially obviates one or more problems due to the limitations and disadvantages of the related art.

One embodiment provides a method for fabricating a reliable semiconductor device without adversely affecting a gate electrode by parameters of peripheral components (e.g., resistors and capacitors). Since bottom and top electrodes of a PIP capacitor comprise or are formed from polysilicon, which is a material used to form a gate electrode of a logic transistor, the bottom or top electrode of the PIP capacitor can be formed simultaneously with the gate electrode of the logic transistor using the same process.

Additional advantages, objects, and features of the invention will be set forth in part in the description which follows and in part will become apparent to those having skill in the art upon examination of the following or can be learned from practice of the invention. The objectives and other advantages of the invention can be realized and attained by the structure particularly pointed out in the written description and claims hereof as well as the appended drawings.

To achieve these objects and other advantages in accordance with the purpose of the present invention, as embodied and broadly described herein, there is provided a method for fabricating a semiconductor device, including forming a device isolation layer in a capacitor region of a silicon substrate, the silicon substrate including the capacitor region and a transistor region; forming a bottom electrode and a dielectric layer on the device isolation layer; forming insulation sidewalls on sides of the bottom electrode; forming resistors in both the capacitor region and the transistor region; simultaneously forming a top electrode on the dielectric layer and a gate electrode in the transistor region of the silicon substrate; and forming source/drain impurity regions in the silicon substrate at sides of the gate electrode.

The details of one or more embodiments are set forth in the accompanying drawings and the description below. Other features will be apparent from the description, the drawings, and the claims. It is to be understood that both the general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention.

In the drawings:

FIG. 6 is a cross-sectional view of a semiconductor device according to the embodiments of the invention, wherein a second polysilicon layer is formed and patterned to form a top capacitor electrode 107 and a gate electrode 107a, and source/drain regions 108 are formed after forming the gate electrode 107a.

DETAILED DESCRIPTION OF THE EMBODIMENTS

Reference will now be made in detail to the embodiments of the present disclosure, examples of which are illustrated in the accompanying drawings. Wherever possible, the same reference numbers will be used throughout the drawings to refer to the same or like parts.

FIGS. 2 through 6 are cross-sectional views sequentially illustrating a method for fabricating a semiconductor device according to embodiments of the present invention.

Figure 1:
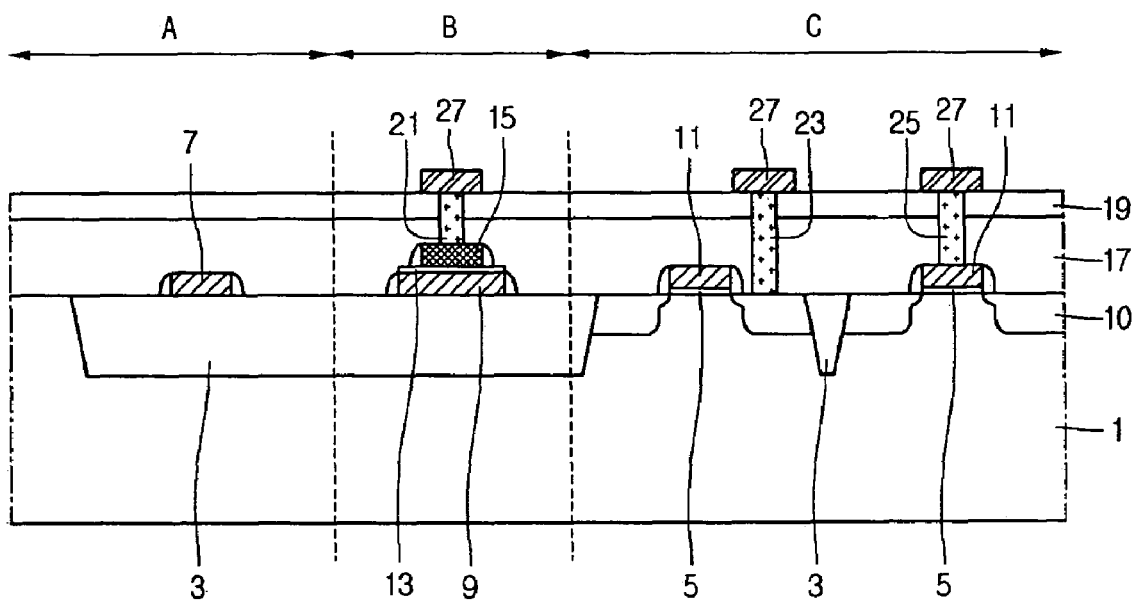
FIG. 1 is a cross-sectional view illustrating a semiconductor device including a polysilicon/insulator/polysilicon (PIP) capacitor, a MOS transistor, and a logic circuit.
Figure 2:
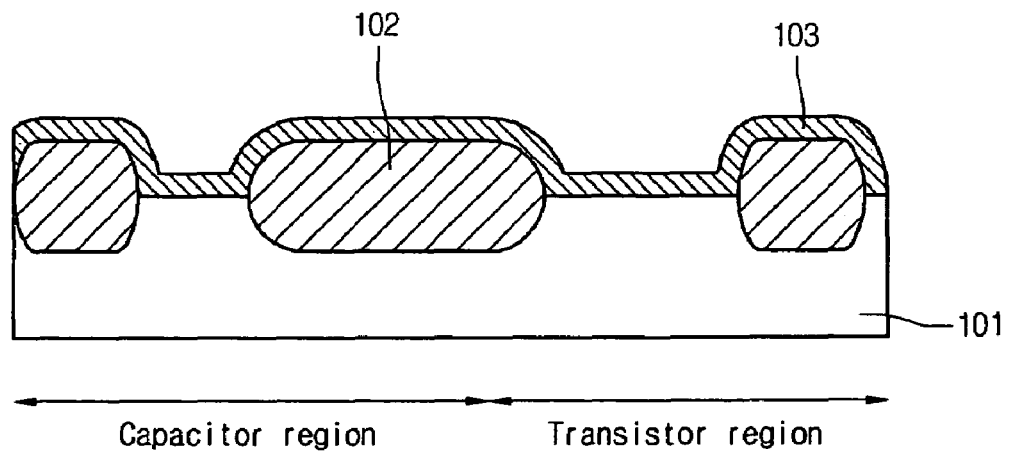
FIG. 2 is a cross-sectional view of a semiconductor device according to the embodiments of the invention, wherein an device isolation layer 102 is formed in a substrate 101 and a first polysilicon layer 103 is formed over the substrate 101.

Referring to FIG. 2, a device isolation layer 102 is formed in a predetermined region of a silicon substrate 101 that is divided into transistor and capacitor regions. The device isolation layer 102 defines an active region in silicon substrate 101. In one embodiment, the substrate includes a single crystal silicon wafer (which may have an epitaxial silicon layer formed thereon) with device isolation (e.g., field oxide) structures 102 therein. Device isolation layer 102 may be formed by conventional techniques (e.g., Local Oxidation of Silicon [LOCOS] or Shallow Trench Isolation [STI]).

Polysilicon/insulator/polysilicon (PIP) capacitors may be formed on the device isolation layer 102 in subsequent process steps. Thus, the device isolation layer 102 may have a sufficiently large area to provide a relatively flat surface on which to fabricate the PIP capacitor. Also, since an etching process is performed in subsequent processing steps, the device isolation layer 102 may have a sufficiently large depth to insulate devices from each other.

Still referring to FIG. 2, a first polysilicon layer 103 for a bottom electrode 103a of a PIP capacitor may be formed on the entire surface of the silicon substrate 101 including the device isolation layer 102. First polysilicon layer 103 may be formed by methods such as chemical vapor deposition (CVD), which may be plasma-enhanced [PECVD or HDPCVD], or at low pressure [LPCVD]) from a precursor such as silane gas, dichlorosilane, etc. The substrate is then annealed to crystallize the polysilicon layer.

An oxide layer (not shown) may be formed over the at least the active regions of the substrate 101 prior to forming first polysilicon layer 103. The oxide layer may be formed by chemical vapor deposition (PECVD, HDPCVD, or LPCVD), blanket deposition, or wet or dry thermal oxidation.

Figure 3:
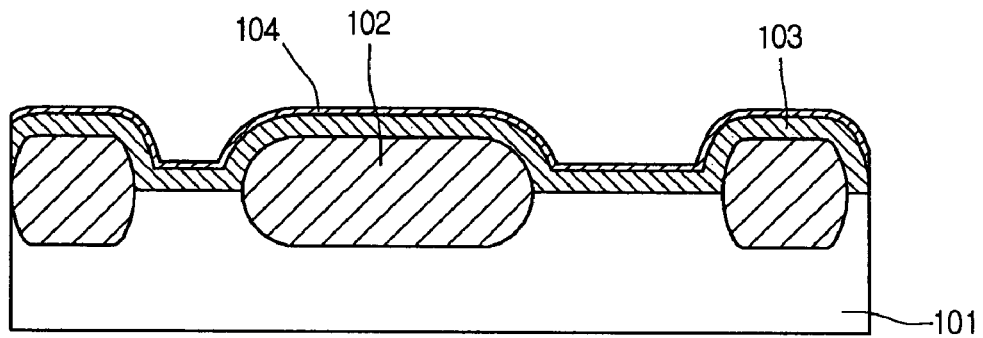
FIG. 3 is a cross-sectional view of a semiconductor device according to the embodiments of the invention, wherein a dielectric layer 104 is formed over the first polysilicon layer 103.

Referring to FIG. 3, a dielectric layer 104 is formed on the first polysilicon layer 103 as a dielectric layer for a PIP capacitor. The dielectric layer 104 preferably comprises a material such as silicon dioxide, silicon nitride, a silicon oxynitride, or a high k dielectric such as aluminum oxide, hafnium dioxide, etc. In one embodiment, dielectric layer 104 comprises an oxide-nitride-oxide (ONO) layer. However, the dielectric layer 104 can alternatively comprise an oxide including a transition element and a rare-earth element, or a ferroelectric material such as $BaTiO_3$, $PbTiO_3$, and $SrTiO_3$.

Figure 4:
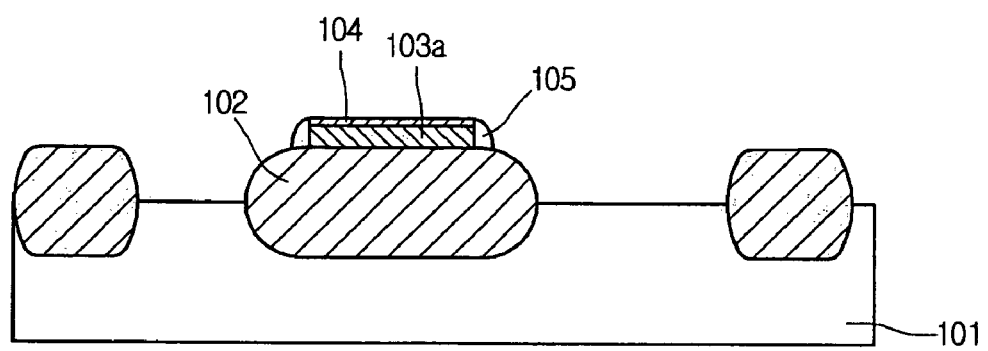
FIG. 4 is a cross-sectional view of a semiconductor device according to the embodiments of the invention, wherein the first polysilicon layer 103 and the dielectric layer 104 are patterned to form a bottom capacitor electrode 103a and resistors 103b, and sidewalls 105 are formed around the bottom electrode 103a and resistors 103b.

Referring to FIG. 4, the dielectric layer 104 and the first polysilicon layer 103 are selectively removed by photolithography (e.g., conventional photoresist deposition, selective irradiation through a mask, and subsequent development) and etching so as to simultaneously form a bottom electrode 103a and resistors 103b on predetermined portions of the device isolation layer 102.

Next, an insulation layer is formed on the entire surface of the silicon substrate 101 including the bottom electrode 103a. The insulation layer is subsequently etched back by blanket etching to form insulation sidewalls 105 on sides of the bottom electrode 103a.

The insulation layer can be formed as a stacked structure including a capping oxide layer and a nitride layer. However, the insulation layer is not limited to the stacked structure. For example, the insulation layer can comprise or be formed of a single oxide or nitride layer, or a combination of the oxide layer and the nitride layer. The insulation layer may be formed by chemical vapor deposition (PECVD, HDPCVD, or LPCVD), physical vapor deposition, or blanket deposition.

Figure 5:
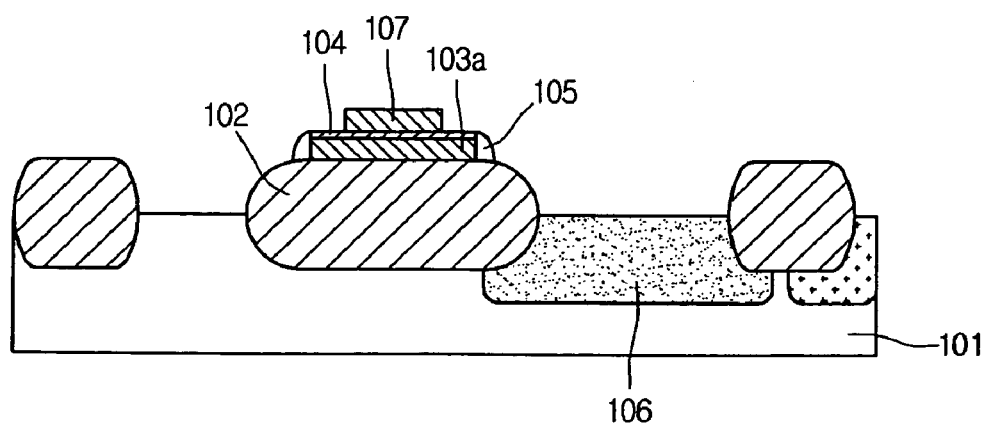
FIG. 5 is a cross-sectional view of a semiconductor device according to the embodiments of the invention, wherein ions are implanted into a transistor region of the substrate 101 to form a well region 106.

Referring to FIG. 5, n or p type dopant ions are selectively implanted into the transistor region of the silicon substrate 101 to form a well region 106 and a complementary well region (not numbered, but indicated by the dotted region in substrate 101). Generally, the non-implanted regions are protected prior to ion implantation by photolithographic masking with a photoresist.

A gate oxide layer (not shown) may be formed over the substrate in the region of well 106 prior to forming a second polysilicon layer. The gate oxide layer may be formed by chemical vapor deposition (PECVD, HDPCVD, or LPCVD), blanket deposition, or (preferably) thermal oxidation.

Figure 6:
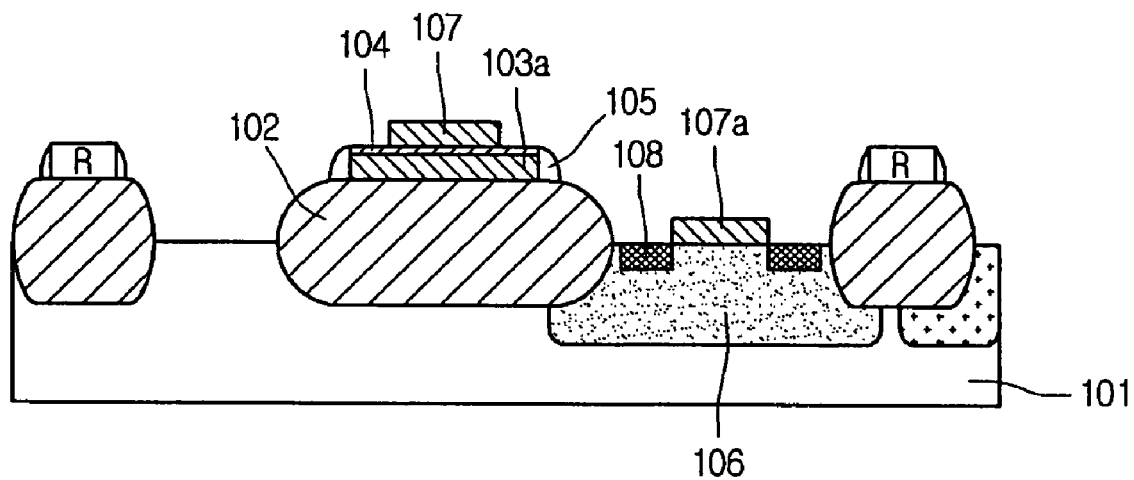

As shown in FIG. 6, the second polysilicon layer for a PIP top electrode 107 is formed on the entire surface of the silicon substrate 101 including the bottom electrode 103a. Next, portions of the second polysilicon layer are selectively removed by photolithography (e.g., conventional photoresist deposition, selective irradiation through a mask, and subsequent development) and etching to form the top electrode 107 of a PIP capacitor over dielectric layer 104. Simultaneously, a gate electrode 107a may be formed over the gate oxide layer in the well region 106. In an alternative embodiment, resistors (e.g., over device isolation structures or regions, as shown in FIG. 6) may be formed by patterning the second polysilicon layer.

The top electrode 107 and the overall structure of the PIP capacitor are formed in the capacitor region of the silicon substrate 101. The top electrode 107a is also positioned over the bottom electrode 103a and has a width less than that of the bottom electrode 103a in at least one region, to facilitate forming a contact to the bottom electrode 103a. When the second polysilicon layer is selectively etched to form the top electrode 107, a gate electrode 107a may also be formed in the transistor region of the silicon substrate 101.

The top electrode 107, the ONO layer 104, the bottom electrode 103a form a PIP capacitor.

Referring to FIG. 6, source/drain impurity regions 108 may be formed in the transistor region of the silicon substrate 101. Specifically, impurity ions (complementary to those in the well region 106) are implanted into the silicon substrate 101 in the well region 106 using the gate electrode 107a as a mask. A second insulation layer (not shown) may then be formed over the entire substrate by blanket deposition, including the top electrode 107 and the gate electrode 107a. The second insulation layer may be subsequently etched back by blanket etching to form second insulation sidewalls (not shown) on sides of the top electrode 107 and the gate electrode 107a.

Figure 7:
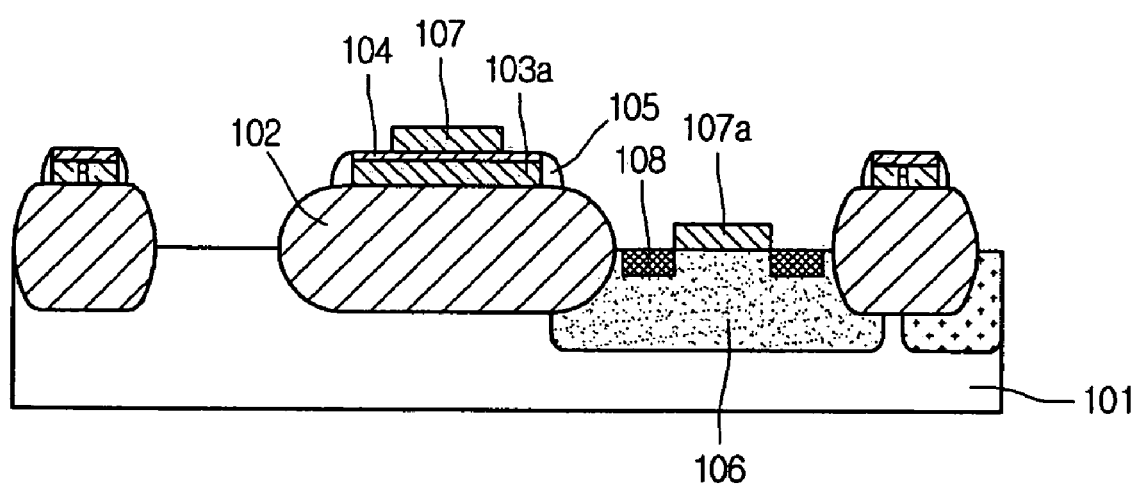
FIG. 7 is a cross-sectional view of a semiconductor device according to the embodiments of the invention, wherein resistors (107b) are alternatively formed simultaneously with the top electrode 107 and gate electrode 107a by etching the second polysilicon layer.

FIG. 7 shows an alternative embodiment, wherein resistors 107b (R) may be formed on device isolation layer 102 simultaneously with the bottom electrode 103a by etching the first polysilicon layer. In the alternative embodiment, the insulating sidewalls may also be formed around resistors 107b by etching back the insulating layer that forms sidewalls 105 on the bottom capacitor electrode.

In a further alternative embodiment, resistors 107b (R) may be formed on device isolation layer 102 simultaneously with the top electrode 107 and the gate electrode 107a by etching the second polysilicon layer.

Subsequently, a wiring process is performed to form a transistor in the transistor region. Interlayer insulation layers (not shown) may be formed on the silicon substrate 101, including on the resistors 103b (or 107b), the PIP capacitor, and gate electrode 107a. Contact holes (not shown) may be formed through the interlayer insulation layers to expose parts of the PIP capacitor electrodes, source/drain terminals 108 and the gate electrode 107a. Then contact plugs (not shown) may be formed in the contact holes to electrically connect the PIP capacitor, source/drain terminals 108 and the gate electrode 107a with overlying metallization. Metal lines (not shown) may then be formed to connect the contact plugs.

According to the example embodiments as described above, the present semiconductor device fabricating method provides advantages as follows.

First, the top electrode of the PIP capacitor and the gate electrode of the transistor can be formed using the same polysilicon layer after the bottom electrode of the PIP capacitor is formed. As a result, the semiconductor device can be less damaged or adversely affected by requirements for the bottom capacitor, and be fabricated with less consideration of the PIP thermal budget.

Additionally, because the insulation sidewalls are formed on both sides of the bottom electrode, the topology of the semiconductor device can be stably maintained when the second polysilicon layer is formed for the top electrode and gate electrode or a rinsing process is performed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. It is intended that the present invention covers the modifications and variations of this invention provided they come within the scope of the appended claims and their equivalents.

What is claimed is:

1. A method for fabricating a semiconductor device comprising:
    forming device isolation structures in a capacitor region of a silicon substrate;
    forming a bottom electrode and a dielectric layer on a first device isolation structure;
    forming a capping oxide layer and a nitride layer on an entire surface of the silicon substrate including the bottom electrode, and performing a blanket etchback process on the capping oxide layer and the nitride layer to form insulation sidewalls on sides of the bottom electrode;
    simultaneously forming a top electrode on the dielectric layer and a gate electrode in a transistor region of the silicon substrate, wherein the top electrode has a width less than a width of the bottom electrode; and
    forming source/drain impurity regions in the silicon substrate at sides of the gate electrode.

2. The method according to claim 1, wherein the dielectric layer comprises an oxide-nitride-oxide structure.

3. The method of claim 1, wherein the dielectric layer comprises an oxide layer including a transition element and a rare-earth element.

4. The method of claim 3, wherein the dielectric layer comprises $BaTiO_3$, $PbTiO_3$, or $SrTiO_3$.

5. The method of claim 4, wherein the well region is formed after forming the insulation sidewalls and before forming the gate electrode.

6. The method according to claim 1, further comprising implanting ions into the transistor region of the silicon substrate to form a well region.

7. The method of claim 1, wherein forming the bottom electrode comprises forming a first polysilicon layer over the entire silicon substrate.

8. The method of claim 7, wherein the dielectric layer is deposited over the entire first polysilicon layer.

9. The method of claim 8, wherein forming the bottom electrode comprises patterning the dielectric layer and the first polysilicon layer.

10. The method of claim 9, wherein patterning the dielectric layer and the first polysilicon layer simultaneously forms resistors on second device isolation structures in a transistor region and in a capacitor region.

11. The method of claim 1, further comprising forming resistors on each of second device isolation structures in a transistor region and in a capacitor region of the substrate.

12. The method of claim 1, further comprising forming a gate oxide layer in a transistor region of the silicon substrate prior to forming the top electrode and the gate electrode.

13. The method of claim 12, wherein the gate electrode is formed on the gate oxide layer.

14. The method of claim 1, wherein forming the top electrode comprises forming a second polysilicon layer over the entire silicon substrate.

15. The method of claim 14, wherein forming the top electrode comprises patterning the second polysilicon layer.

16. The method of claim 14, wherein patterning the second polysilicon layer simultaneously forms resistors on a second device isolation structure in a transistor region and in a capacitor region.

17. The method of claim 1, further comprising annealing the silicon substrate after forming the bottom electrode.

18. The method of claim 1, wherein forming source/drain impurity regions comprises implanting ions into the substrate in the transistor region using the gate electrode as a mask.

* * * * *